(12) United States Patent
Park et al.

(10) Patent No.: US 6,825,518 B2
(45) Date of Patent: Nov. 30, 2004

(54) CAPACITOR IN SEMICONDUCTOR DEVICE AND METHOD FOR FABRICATING THE SAME

(75) Inventors: Cheol Hwan Park, Seoul (KR); Dong Su Park, Kyoungki-do (KR); Tae Hyeok Lee, Kyoungki-do (KR); Sang Ho Woo, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/331,532

(22) Filed: Dec. 30, 2002

(65) Prior Publication Data

US 2004/0041191 A1 Mar. 4, 2004

(30) Foreign Application Priority Data

Aug. 28, 2002 (KR) .................. 10-2002-0051076

(51) Int. Cl.[7] .............................................. H01L 29/72
(52) U.S. Cl. .................. 257/303; 257/304; 257/306; 257/310; 257/533; 438/210; 438/238; 438/240; 438/253
(58) Field of Search ................................ 257/303, 304, 257/306, 310, 533; 438/210, 238, 240, 253

(56) References Cited

U.S. PATENT DOCUMENTS 6,341,056 B1   1/2002   Allman et al.
6,417,537 B1   7/2002   Yang et al.
6,451,667 B1   9/2002   Ning
2003/0052358 A1 * 3/2003 Weimer .................. 257/310

FOREIGN PATENT DOCUMENTS

JP   63316465    12/1988
JP    6089968     3/1994
JP    6310654    11/1994

* cited by examiner

Primary Examiner—Edward Wojciechowicz
(74) Attorney, Agent, or Firm—Ladas & Parry LLP

(57) ABSTRACT

A capacitor in a semiconductor device and a method for fabricating the same is disclosed. Disclosed the method for fabricating the capacitor in a semiconductor device comprises the steps of: forming a lower electrode made of doped silicon materials on a semiconductor substrate; depositing a thin silicon nitride layer on the lower electrode; forming a silicon oxynitride layer on the surface of the silicon nitride layer through oxidation of the silicon nitride layer; depositing a dielectric layer on the silicon oxynitride layer; and forming an upper electrode on the dielectric layer. According to the method, after the deposition of the silicon nitride layer on the dielectric layer, oxidation treatment of the resultant structure is performed and the dielectric layer is formed on the oxidized silicon nitride layer, thereby improving the interface characteristics between the lower electrode and the dielectric layer and resulting in a decrease of the leakage current and an increase of the breakdown voltage of the capacitor in the semiconductor device.

16 Claims, 3 Drawing Sheets

CAPACITOR IN SEMICONDUCTOR DEVICE AND METHOD FOR FABRICATING THE SAME

BACKGROUND OF THE INVENTION

1. Field of the Invention

The present invention relates to a capacitor in a semiconductor device, and more particularly to a capacitor in a semiconductor device and a method for fabricating the same capable of improving leakage current and breakdown voltage characteristics.

2. Description of the Prior Art

As generally known in the art, the cell size of semiconductor memory devices decreases as they become more highly integrated. Therefore, it is difficult to secure a capacitance of a capacitor adequate for the maintenance of the memory device characteristics as uniformly as required, since the area of the capacitor decreases due to the decrease of the cell size.

For example, in the case of a highly integrated device above the 64 M DRAM level, the cell size has been seriously reduced following the increase of the degree of integration. As a result, it is impossible to secure capacitance of a capacitor adequate for the activation of the cell with the conventional capacitor structure as required.

Accordingly, with regard to the recent highly integrated devices, electric charge storage electrodes have been formed in various three-dimensional structures to secure desired amounts of capacitance of a capacitor as above, or high dielectric ratio materials have been employed as dielectric layer materials, or the dielectric layer have been deposited thin at the maximum.

These are because the capacitance for a capacitor is directly proportional to the surface area of the electrode and the dielectric ratio of the dielectric layer and inversely proportional to the interval between an upper electrode and a lower electrode, i.e., the approximate thickness of the dielectric layer.

In this regard, lower electrodes have been fabricated in a cylindrical structure, a concave structure, or a pin structure to increase the surface area of the electrodes and thereby increasing the capacitance for a capacitor; high dielectric ratio materials such as $Ta_2O_5$ or BST have been employed as the dielectric materials to increase the capacitance for a capacitor; and a thin layer consisting of multiple layers of N/O (nitride/oxide) have been employed to increase the capacitance for a capacitor by reducing the thickness of the dielectric layer.

However, in the case of employing high dielectric ratio materials to increase the capacitance for a capacitor, due to limitations on decreasing the thickness of the dielectric layer, several problems have been incurred as follows.

In particular, in the cases of employing N/O multi-layers or employing high dielectric materials such as $Ta_2O_5$ or BST as dielectric layer materials, recent technologies have confronted limitations in the treatment of interfaces between the lower electrode and the dielectric layer. Therefore, the capacitance of a capacitor can be increased through using the N/O multi-layers or high dielectric materials such as $Ta_2O_5$ or BST as dielectric materials while also decreasing the thickness of the dielectric layer. However, leakage current and breakdown voltage characteristics, etc., deteriorate due to inferiority of the interfaces between the lower electrode and the dielectric layer, resulting in reduction of reliability and production yield.

As described above, at the present stage of development in employing N/O multi-layers or high dielectric materials such as $Ta_2O_5$ or BST as dielectric layer materials, such materials cause a decrease of reliability and production yield, so it is difficult to apply them in order to increase the capacitance of a capacitor in the semiconductor device.

SUMMARY OF THE INVENTION

Accordingly, the present invention has been made to solve the above-mentioned problems occurring in the prior art, and an object of the present invention is to provide a capacitor in a semiconductor device and a method for fabricating the same capable of preventing the deterioration of leakage current and breakdown voltage characteristics by using N/O multi-layers or high dielectric materials such as $Ta_2O_5$ or BST as dielectric layer materials.

In order to accomplish this object, there is provided a capacitor in a semiconductor device, comprising: a lower electrode made of doped silicon materials formed on a semiconductor substrate; a thin silicon nitride layer formed on the lower electrode; a silicon oxynitride layer formed on the surface of the silicon nitride layer through oxidation of the silicon nitride layer; a dielectric layer formed on the silicon oxynitride layer; and an upper electrode formed on the dielectric layer.

In the above capacitor, the lower electrode is formed of any one structure selected from a group composed of a plate structure, a cylindrical structure, a concave structure, and a pin structure, and is formed to have a hemispherical silicon grain on the surface thereof.

Also, the silicon nitride layer is formed to a thickness of 5 to 30 Å and the silicon oxynitride layer is formed to have a thickness of under 15 Å from the surface of the silicon nitride layer.

Further, the dielectric layer is made of N/O or $Ta_2O_5$.

In order to accomplish this object, there is also provided a method for fabricating a capacitor in a semiconductor device, comprising the steps of: forming a lower electrode made of doped silicon materials on a semiconductor substrate; depositing a thin silicon nitride layer on the lower electrode; forming a silicon oxynitride layer on the surface of the silicon nitride layer through oxidation of the silicon nitride layer; depositing a dielectric layer on the silicon oxynitride layer; and forming an upper electrode on the dielectric layer.

In the above method, the lower electrode is formed of any one structure selected from a group composed of a plate structure, a cylindrical structure, a concave structure, and a pin structure, and is formed to have a hemispherical silicon grain on the surface thereof.

Also, the step of depositing a thin silicon nitride layer is performed through any one process selected from a group composed of a plasma $NH_3$ nitridation process, a thermal $NH_3$ nitridation process, and an LPCVD process, and the silicon nitride layer is deposited to a thickness of 5 to 30 Å.

In accordance with the embodiment of the present invention, the oxidation of the silicon nitride layer is performed through any one process selected from a group composed of a plasma enhanced oxidation, a low pressure oxidation, an atmosphere pressure oxidation, and a natural air cooling at an atmosphere of $O_2$, and is performed to form the silicon nitric oxide layer to a thickness of below 15 Å from the surface of the silicon nitride layer.

Further, in the above method, the dielectric layer is made of N/O or $Ta_2O_5$, and the post treatment of the dielectric layer is performed through a heat treatment using $O_2$, $N_2$, or N/O.

Also, in the above method, a post treatment of the deposited dielectric layer using any one gas selected from the group composed of $O_2$, $N_2$, and NO, is performed prior to forming the upper electrode and after depositing the dielectric layer.

In accordance with the method of the present invention, the steps of depositing the silicon nitride layer, oxidizing the silicon nitride layer, depositing the dielectric layer, and performing post treatment of the dielectric layer are carried out in an in-situ or no time delay manner.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1A:
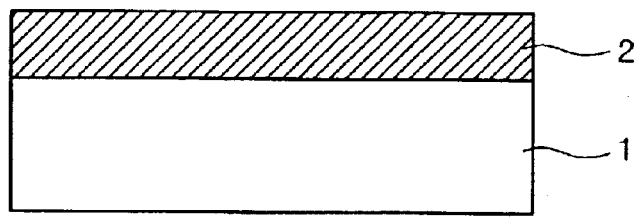
FIGS. 1A to 1E are cross-sectional views for illustrating each step of a method for fabricating a capacitor in a semiconductor device in accordance with one embodiment of the present invention.

Referring to FIG. 1A, a doped silicon layer is deposited on a semiconductor substrate 1 equipped with a desired lower base layer (not shown) to form a lower electrode 2 through patterning the doped silicon layer. In this instance, although the lower electrode 2 has been depicted in a plate form, it can be formed in a cylindrical structure, a concave structure, or a pin structure in order to increase the capacitance of a capacitor, and it can be formed to have a hemispherical silicon grain (HSG) on the surface thereof.

Figure 1B:
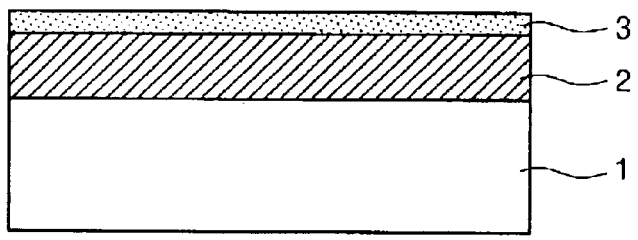

Referring to FIG. 1B, a cleaning process is performed upon the resultant structure of the substrate wherein the lower electrode 2 has been formed. Then, a thin silicon nitride layer is deposited on the surface of the lower electrode 2 to improve the interface characteristics between the dielectric layers. In this instance, the thin silicon nitride layer 3 can be deposited through a deposition process of the silicon nitride layer using N-LPCVD, a nitridation process using a plasma $NH_3$ treatment, or a nitridation process using a thermal $NH_3$ treatment, etc., preferably to a thickness of 5 to 30 Å.

Figure 1C:
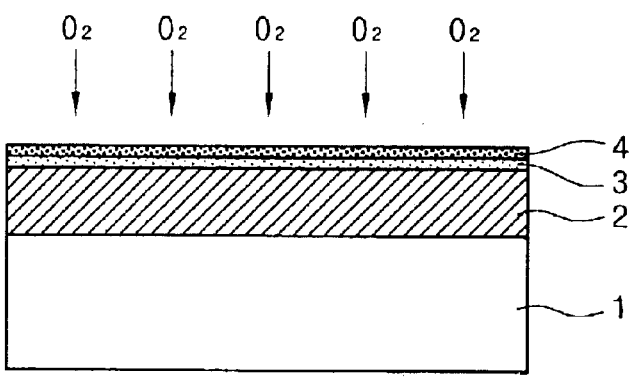

Referring to FIG. 1C, an oxidation treatment is performed to the silicon nitride layer 3 to oxidize the surface of the silicon nitride layer thereby forming a silicon oxynitride ($SiO_xN_y$) layer 4 on the surface of the silicon nitride layer 3. When the oxidation treatment has been performed, the surface of the silicon nitride layer 3 has been slightly oxidized, and defects such as pin holes and trap sites in the layer are removed without decreasing the entire dielectric ratio of the silicon nitride layer 3.

Accordingly, when a dielectric layer is deposited on the silicon oxynitride layer 4 in the following process, the silicon oxynitride layer 4 improves the interface characteristics between the lower electrode and the dielectric layer, especially suppressing a hole current in the oxidized silicon nitride layer and thereby decreasing the leakage current in the capacitor and increasing the breakdown voltage, i.e., voltage of breaking the insulation of the capacitor.

Further, since the oxidized silicon nitride layer, i.e., silicon oxynitride layer 4, has a better oxidation-resistance than that of the silicon nitride layer 3, the oxidation-resistance of the post-treatment after the deposition of the dielectric layer, i.e., after the thermal oxidation in the ONO capacitor or the $N_2O$ treatment, in the $Ta_2O_5$ capacitor becomes better than that of the conventional case, thereby suppressing the oxygen diffusion into the doped silicon layer which constitutes the lower electrode, resulting in the prevention of the reduction of the dielectric characteristics.

According to the above embodiment of the present invention, the oxidation of the silicon nitride layer 3 can be performed through a plasma enhanced oxidation, a low pressure oxidation, an atmosphere pressure oxidation, or a natural air cooling in an atmosphere of $O_2$, i.e., a cooling process carried out intentionally in an atmosphere of $O_2$ after the deposition of the silicon nitride layer, and it is performed to form the silicon oxynitride layer 4 to a thickness of under 15 Å measured from the surface of the silicon nitride layer 3.

Figure 1D:
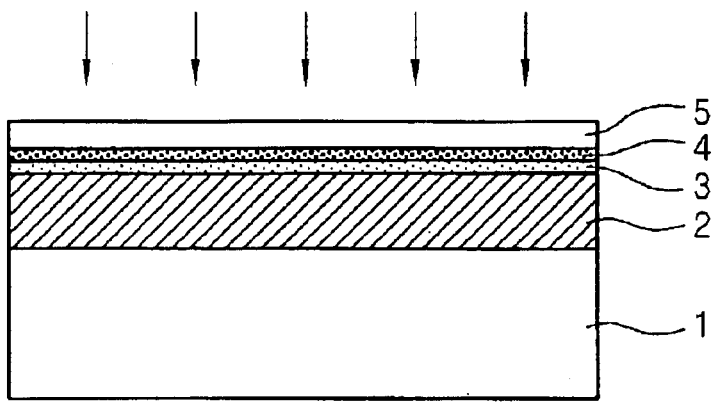
Figure 1E:
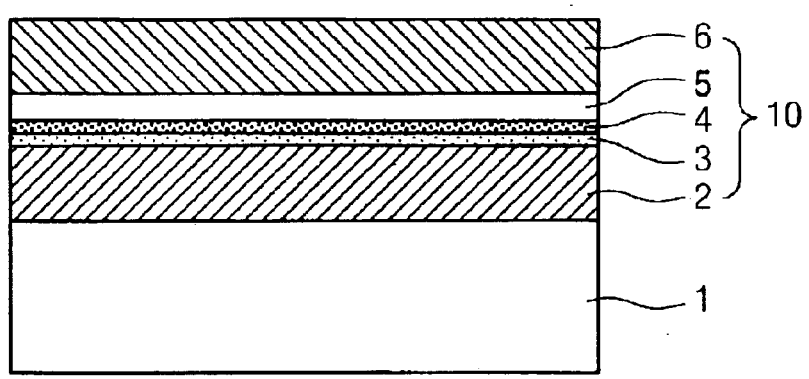

Referring to FIG. 1D, a thin dielectric layer 5 made of NO or $Ta_2O_5$ is deposited on the silicon oxynitride layer 4. Then, a post treatment, i.e., a thermal treatment using $O_2$, $N_2$, NO or $O_2$ is performed upon the deposited dielectric layer 5 to remove and crystallize pin holes, oxygen vacancies, etc., in the layer, thereby improving the dielectric characteristics of the dielectric layer 5.

In this instance, in the case of using NO layer as a material for the dielectric layer 5, the dielectric layer 5 comes to have an NONO or ONONO structure in relation to the formation of the silicon oxynitride layer 4 on the silicon nitride layer 3.

Referring to 1E, a conductive layer for the upper electrode, i.e., a doped silicon layer or an aluminium metal layer, etc. is deposited on the dielectric layer 5. Then, the upper electrode 6 is formed by patterning the conductive layer, resulting in the formation of the capacitor of the present invention, which is composed of a stacked structure made of the lower electrode 2, the silicon oxynitride layer 4, the dielectric layer 5 and the upper electrode 6.

Meanwhile, according to the above embodiment of the present invention, impurity-doping of the silicon layer that forms the lower electrode, deposition of the silicon nitride layer, oxidation of the surface of the silicon nitride layer, deposition of the dielectric layer and the following heat treatment to the dielectric layer may preferably be performed in an in-situ or no time delay manner.

According to the method for fabricating a capacitor in the semiconductor device of the present invention, a thin silicon nitride layer is deposited on the doped silicon layer that constitutes the lower electrode and oxidizes the surface thereof and then a dielectric layer is deposited to thereby mitigate interface stress and suppress the electrical charge trapped in the interface.

In particular, the silicon oxynitride layer acts as a buffer layer at the time of depositing the dielectric layer to thereby mitigate micro-stress and suppress the oxygen diffusion into the doped silicon layer which constitutes the lower electrode as a result of good oxidation resistance, thus completing the production of the capacitor for a semiconductor device that has a higher capacitance than the conventional case under conditions of the same leakage current and breakdown voltage.

Figure 2A:
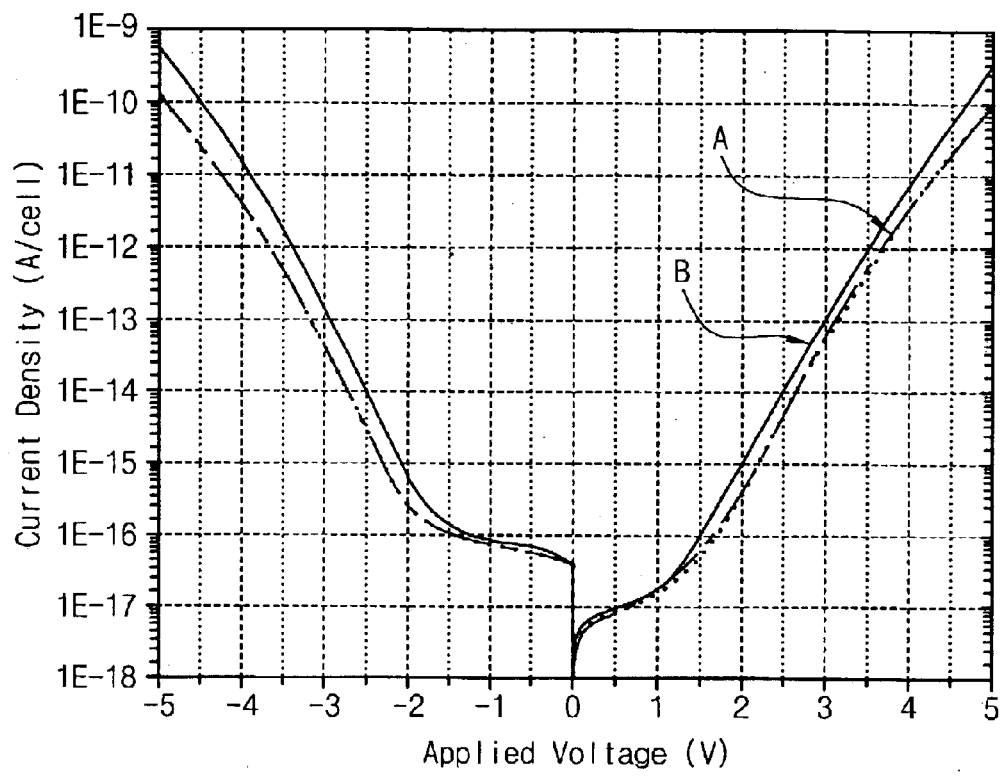
FIGS. 2A and 2B are graphs for illustrating electrical characteristics of the capacitor in accordance with the present invention.
Figure 2B:
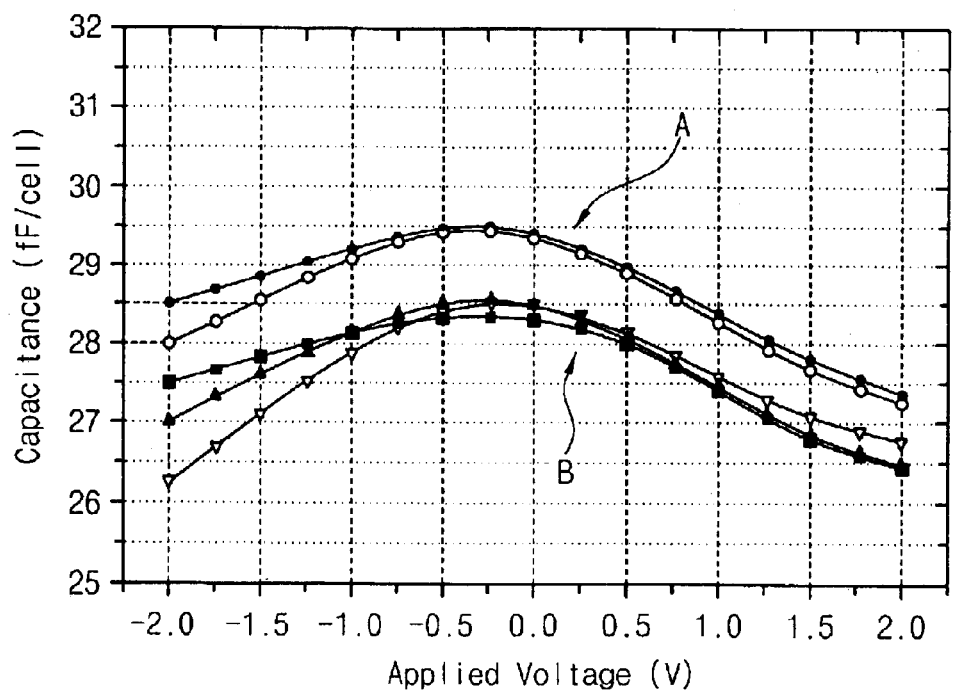

FIGS. 2A and 2B are graph views for illustrating an electrical characteristics of the capacitor in the semiconductor device of the present invention, in which FIG. 2A is a graph view showing the relation between the applied voltage and the current density, and FIG. 2B is a graph view showing the relation between the applied voltage and the capacitance of the capacitor.

Referring to FIGS. 2A and 2B, the capacitor having an ONO structure of the present invention, wherein the oxidized silicon nitride layer has been applied, shows a low leakage current and high breakdown voltage characteristics, and an increase of the capacitance in comparison with the conventional capacitor having a normal ONO structure.

Tables 1 and 2 show test results of the capacitance and the breakdown voltage of the capacitor having the ONO structure and the $Ta_2O_5$ structure, respectively corresponding to the case of application of the oxidized silicon nitride layer and the case of without the oxidized silicon nitride layer.

TABLE 1

| Test results of the device produced in bulk | Capacitance | | Breakdown voltage (V) | |
| --- | --- | --- | --- | --- |
| Normal ONO capacitor | 33.14 fF/cell | 2.63 fF/cell | 3.41 V | 0.11 V improvement |
| ONO structure to which oxidized silicon nitrade layer is applied | 35.51 fF/cell | improvement | 3.52 V | |

TABLE 2

| Test results of the plate capacitor | Capcitance | | Breakdown voltage (V) | |
| --- | --- | --- | --- | --- |
| $Ta_2O_5$ capacitor performed of pretreatment of $NH_3$ | 10.9 fF/$\mu m^2$ | 1.6 fF/cell | 3.7 V | 0.4 V improvement |
| $Ta_2O_5$ capacitor to which oxidized silicon nitride layer is applied | 12.5 fF/$\mu m^2$ | improvement | 4.1 V | |

As shown in FIGS. 2A and 2B, and as apparent from tables 1 and 2, the capacitor of the present invention wherein an oxidized silicon nitride layer has been applied, shows better leakage current and breakdown voltage characteristics than that of the conventional capacitor, thereby being able to suppress the reduction of the dielectric ratio and provide a higher capacitance than that of the conventional capacitor under conditions of the same leakage current and breakdown voltage.

As described above, the capacitor in the semiconductor device fabricated in accordance with the present invention improves the interface characteristics between the lower electrode and the dielectric layer through deposition of a silicon nitride layer and oxidation of the surface thereof to thereby suppressing the hole current at the time of applying a bias to the capacitor, resulting in decrease of the leakage current, increase of the breakdown voltage and improvement in both the reliability and production yield.

Also, the present invention can prevent oxygen diffusion into the lower electrode at the time of performing the post treatment of the dielectric layer, thereby preventing deterioration of the overall dielectric ratio of the dielectric layer, resulting in the increase of the capacitance of the capacitor.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A capacitor in a semiconductor device, comprising:

a lower electrode made of doped silicon materials formed on a semiconductor substrate;

a thin silicon nitride layer formed on the lower electrode;

a silicon oxynitride layer formed on the surface of the silicon nitride layer through oxidation of the silicon nitride layer;

a dielectric layer formed on the silicon oxynitride layer, wherein at least a better oxidation-resistance is obtained by forming the dielectric layer on the silicon oxynitride layer than forming a dielectric layer on a silicon nitride layer; and an upper electrode formed on the dielectric layer.

2. The capacitor according to claim 1, wherein the lower electrode is formed of any one structure selected from a group composed of a plate structure, a cylindrical structure, a concave structure, and a pin structure.

3. The capacitor according to claim 1, wherein the lower electrode is formed to have a hemispherical silicon grain on the surface thereof.

4. The capacitor according to claim 1, wherein the silicon nitride layer is formed to a thickness of 5 to 30 Å.

5. The capacitor according to claim 1, wherein the silicon oxynitride layer is formed to have a thickness of under 15 Å from the surface of the silicon nitride layer.

6. The capacitor according to claim 1, wherein the dielectric layer is made of N/O or $Ta_2O_5$.

7. A method for fabricating a capacitor in a semiconductor device, comprising the steps of:

forming a lower electrode made of doped silicon materials on a semiconductor substrate;

depositing a thin silicon nitride layer on the lower electrode oxidizing the surface of the thin silicon nitride layer and thereby forming a silicon oxynitride layer on the silicon nitride layer;

depositing a dielectric layer on the silicon oxynitride layer; and forming an upper electrode on the dielectric layer.

8. The method for fabricating a capacitor according to claim 7, wherein the lower electrode is formed of any one structure selected from a group composed of a plate structure, a cylindrical structure, a concave structure, and a pin structure.

9. The method for fabricating a capacitor according to claim 7, wherein the lower electrode is formed to have a hemispherical silicon grain on the surface thereof.

10. The method for fabricating a capacitor according to claim 7, wherein the step of depositing a thin silicon nitride layer is performed through any one process selected from a group composed of a plasma $NH_3$ nitridation process, a thermal $NH_3$ nitridation process, and an LPCVD process.

11. The method for fabricating a capacitor according to claim 7, wherein the silicon nitride layer is deposited to a thickness of 5 to 30 Å.

12. The method for fabricating a capacitor according to claim 7, wherein the oxidation of the silicon nitride layer is performed through any one process selected from a group composed of a plasma enhanced oxidation, a lower pressure oxidation, an atmosphere pressure oxidation, and natural air cooling in an atmosphere of $O_2$.

13. The method for fabricating a capacitor according to claim 7, wherein the oxidation of the silicon nitride layer is performed to form the silicon nitric oxide layer to a thickness of under 15 Å from the surface of the silicon nitride layer.

14. The method for fabricating a capacitor according to claim 7, wherein the dielectric layer is made of N/O or $Ta_2O_5$.

15. The method for fabricating a capacitor according to claim 7, further comprising a step of performing a post treatment of the deposited dielectric layer using any one gas selected from a group composed of $O_2$, $N_2$, and NO, prior to forming the upper electrode and after depositing the dielectric layer.

16. The method for fabricating a capacitor according to claim 7, wherein the steps of depositing the silicon nitride layer, oxidizing the silicon nitride layer, depositing the dielectric layer, and performing post treatment of the dielectric layer are carried out in an in-situ or no time delay manner.

* * * * *